(12) United States Patent
Fujioka et al.

(10) Patent No.: US 12,431,770 B2
(45) Date of Patent: Sep. 30, 2025

(54) POWER ELECTRONICS ASSEMBLY HAVING VERTICALLY STACKED TRANSISTORS

(71) Applicant: Toyota Motor Engineering and Manufacturing North America, Inc., Plano, TX (US)

(72) Inventors: Hitoshi Fujioka, Ann Arbor, MI (US); Shailesh N. Joshi, Ann Arbor, MI (US); Danny J. Lohan, Ann Arbor, MI (US)

(73) Assignee: TOYOTA MOTO ENGINEERING & MANUFACTURING NORTH AMERICA, INC., Plano, TX (US)

( * ) Notice: Subject to any disclaimer, the term of this patent is extended or adjusted under 35 U.S.C. 154(b) by 1365 days.

(21) Appl. No.: 17/089,874

(22) Filed: Nov. 5, 2020

(65) Prior Publication Data
US 2022/0140706 A1    May 5, 2022

(51) Int. Cl.
*H02K 11/33* (2016.01)
*B60L 50/60* (2019.01)
(Continued)

(52) U.S. Cl.
CPC ............ *H02K 11/33* (2016.01); *B60L 50/60* (2019.02); *B60L 53/20* (2019.02); *H01L 23/427* (2013.01); *H01L 23/49575* (2013.01); *H01L 23/49589* (2013.01); *H01L 23/5385* (2013.01); *H01L 23/5389* (2013.01); *H01L 24/32* (2013.01);
(Continued)

(58) Field of Classification Search
CPC .... H02K 11/33; H02K 7/006; H02K 11/0094; B60L 50/60; H01L 23/427; H01L 23/49575; H01L 23/49589; H01L 23/5385; H01L 23/5389; H01L 24/32; H01L 24/33; H01L 25/074; H01L 25/165; H01L 2224/32145; H01L 2224/32245; H01L 2224/33181
See application file for complete search history.

(56) References Cited

U.S. PATENT DOCUMENTS 5,341,075 A * 8/1994 Cocconi .................. B60L 53/20
                                                              307/66
6,215,679 B1 * 4/2001 Yamane ................. H05K 9/002
                                                              363/39
(Continued)

FOREIGN PATENT DOCUMENTS

CN        202931180 U    5/2013
CN        102969875 B    5/2015
(Continued)

OTHER PUBLICATIONS

Gupta, Hansa, "Integrated Power Electronic Module," International Journal of Electrical and Electronics Engineers, vol. No. 6, Issue No. 2, 2014, 11 pages.

*Primary Examiner* — Gary L Laxton
(74) *Attorney, Agent, or Firm* — Jordan IP Law, LLC

(57) ABSTRACT

Methods, apparatuses and systems provide technology that includes a first transistor, a second transistor stacked on the first transistor, at least one electrical conductor that is positioned between the first and second transistors and electrically connected to the first and second transistors, and a busbar that is electrically connected to the first and second transistors through the at least one electrical conductor.

18 Claims, 11 Drawing Sheets

(51) Int. Cl.
   *B60L 53/20* (2019.01)
   *H01L 23/00* (2006.01)
   *H01L 23/427* (2006.01)
   *H01L 23/495* (2006.01)
   *H01L 23/538* (2006.01)
   *H01L 25/07* (2006.01)
   *H01L 25/16* (2023.01)
   *H02K 7/00* (2006.01)
   *H02K 9/20* (2006.01)
   *H02K 11/00* (2016.01)

(52) U.S. Cl.
   CPC ............ *H01L 24/33* (2013.01); *H01L 25/074* (2013.01); *H01L 25/165* (2013.01); *H02K 7/006* (2013.01); *H02K 9/20* (2013.01); *H02K 11/0094* (2013.01); *H01L 2224/32145* (2013.01); *H01L 2224/32245* (2013.01); *H01L 2224/33181* (2013.01)

(56) References Cited

U.S. PATENT DOCUMENTS

| | | | |
|---|---|---|---|
| 6,313,991 B1 | 11/2001 | Nagashima et al. | |
| 7,099,153 B2 | 8/2006 | Yazawa | |
| 7,381,383 B1 | 6/2008 | Yokoyama et al. | |
| 7,796,389 B2 | 9/2010 | Edmunds et al. | |
| 8,361,839 B1* | 1/2013 | Koduri | H01L 25/16 29/874 |
| 8,541,875 B2 | 9/2013 | Bennion et al. | |
| 8,654,541 B2 | 2/2014 | Robert et al. | |
| 9,905,541 B2* | 2/2018 | Ishino | H02M 7/5387 |
| 10,091,874 B2 | 10/2018 | Burns et al. | |
| 10,321,585 B2 | 6/2019 | Nakatsu et al. | |
| 10,332,822 B2 | 6/2019 | Bradfield | |
| 2015/0138734 A1 | 5/2015 | Guo et al. | |
| 2016/0202588 A1* | 7/2016 | Bass | G02F 1/1503 359/265 |
| 2020/0029455 A1 | 1/2020 | Hong et al. | |
| 2020/0152547 A1* | 5/2020 | Alawieh | F28D 15/04 |

FOREIGN PATENT DOCUMENTS

| | | |
|---|---|---|
| CN | 106559000 A | 4/2017 |
| CN | 107947536 A | 4/2018 |
| DE | 102015012915 A1 | 4/2017 |
| DE | 102016224371 A1 | 6/2018 |

\* cited by examiner

POWER ELECTRONICS ASSEMBLY HAVING VERTICALLY STACKED TRANSISTORS

TECHNICAL FIELD

Embodiments generally relate to power electronics assemblies having a reduced size. More particularly, embodiments relate to a power electronics assembly with transistors that are disposed over each other with an electrical conductor connecting the transistors.

BACKGROUND

Semiconductor packages may include numerous electrical components such as power electronic devices (e.g., silicon carbide insulated-gate bipolar transistor or other switching devices) as well as gate drive devices and capacitors. Such semiconductor packages may be used in a variety of contexts, such as the transportation industry (e.g., automotive applications). In the semiconductor packages, the power electronic devices may be separate from the gate drive devices and capacitors. The relative placement and shapes of the power electronic devices, the gate drive devices and capacitors may have impactful effects on performance (e.g., cause parasitic inductance) and size.

BRIEF SUMMARY

In some embodiments a first power electronics apparatus includes a first transistor, a second transistor stacked on the first transistor, at least one electrical conductor that is positioned between the first and second transistors and electrically connected to the first and second transistors, and a busbar that is electrically connected to the first and second transistors through the at least one electrical conductor.

In some embodiments, a vehicle includes an electric motor drive, a battery to supply a current, and a traction inverter package to modify the current of the battery and provide the modified current to the electric motor drive. The traction inverter package includes a first power electronics apparatus comprising a first transistor, a second transistor stacked on the first transistor, at least one electrical conductor that is positioned between the first and second transistors and electrically connected to the first and second transistors, and a busbar that is electrically connected to the first and second transistors through the at least one electrical conductor.

BRIEF DESCRIPTION OF THE SEVERAL VIEWS OF THE DRAWINGS

The various advantages of the embodiments of the instant disclosure will become apparent to one skilled in the art by reading the following specification and appended claims, and by referencing the following drawings, in which:

DETAILED DESCRIPTION

Figure 1A:
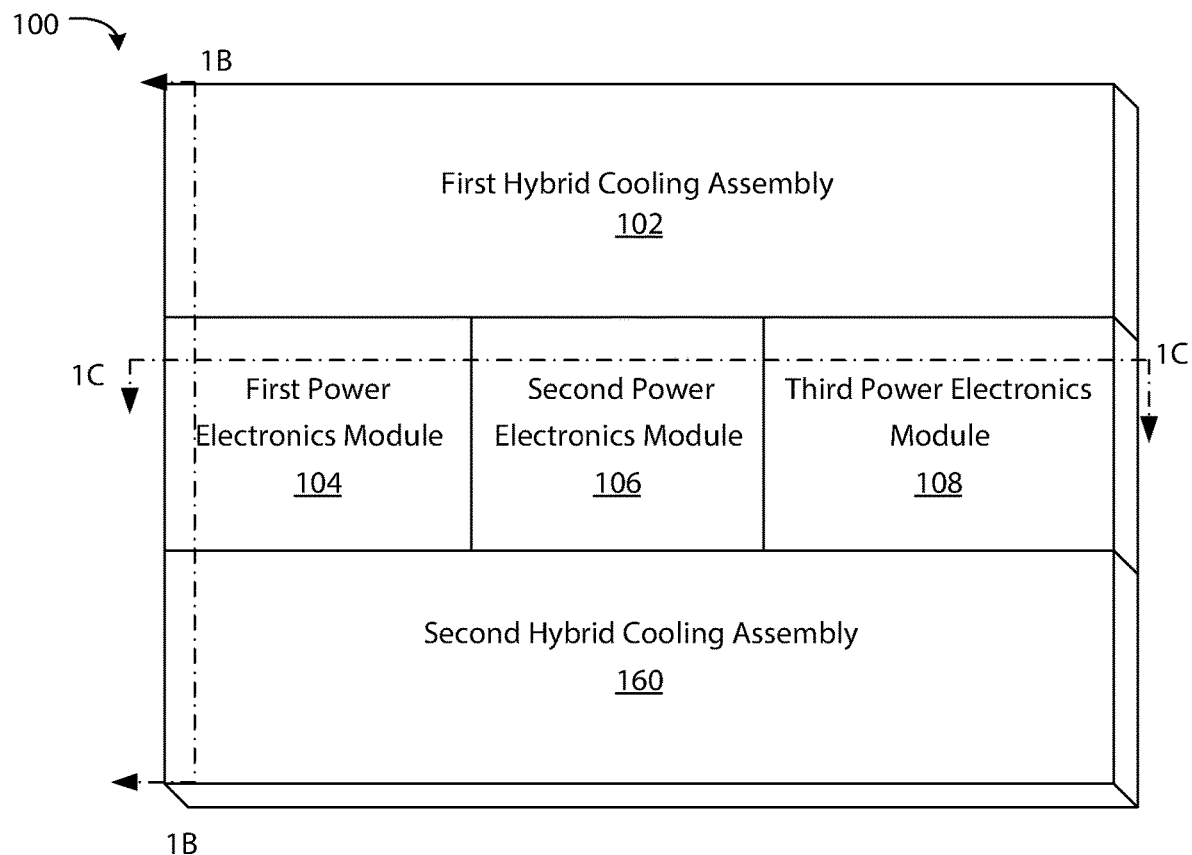
FIG. 1A is a diagram of an example of a power electronics assembly according to an embodiment.
Figure 1A:
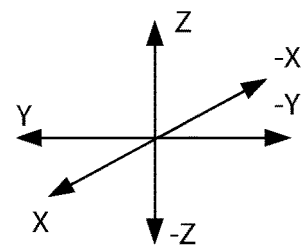

Turning now to FIG. 1A, a power electronics assembly 100 (e.g., an electronics apparatus) is illustrated. The power electronics assembly 100 includes a series of components stacked on each other in a vertical direction (e.g., along the Z-axis). The stacked components may include a first hybrid cooling assembly 102, a first power electronics module 104 (e.g., a first power electronics apparatus), a second power electronics module 106 (e.g., a second power electronics apparatus), a third power electronics module 108 (e.g., a third power electronics apparatus) and a second hybrid cooling assembly 160. As will be discussed in detail, the arrangement of electronics of the first-third power electronics modules 104, 106, 108 may reduce deleterious effects including parasitic inductance, while also reducing the overall size of the power electronics assembly 100. For example, the placement of transistors and busbars relative to each other may permit a reduction in size of the power electronics assembly 100, while also reducing unwanted thermal effects (e.g., high heat concentrations) and electrical effects (e.g., parasitic induction) caused by spacing from switching elements.

Furthermore, the placement of the first hybrid cooling assembly 102 and the second hybrid cooling assembly 160 permits enhanced cooling as will be discussed below. For example, in some embodiments, each of first and second hybrid cooling assemblies 102, 160 includes a two-phase cooling structure which aligns with and cools one or more high heat flux devices (e.g., transistors). Further, each of first and second hybrid cooling assembly 102, 160 may include a single-phase cooling structure which aligns with and cools one or more low heat flux devices such as capacitors and/or gate drive devices.

Figure 1B:
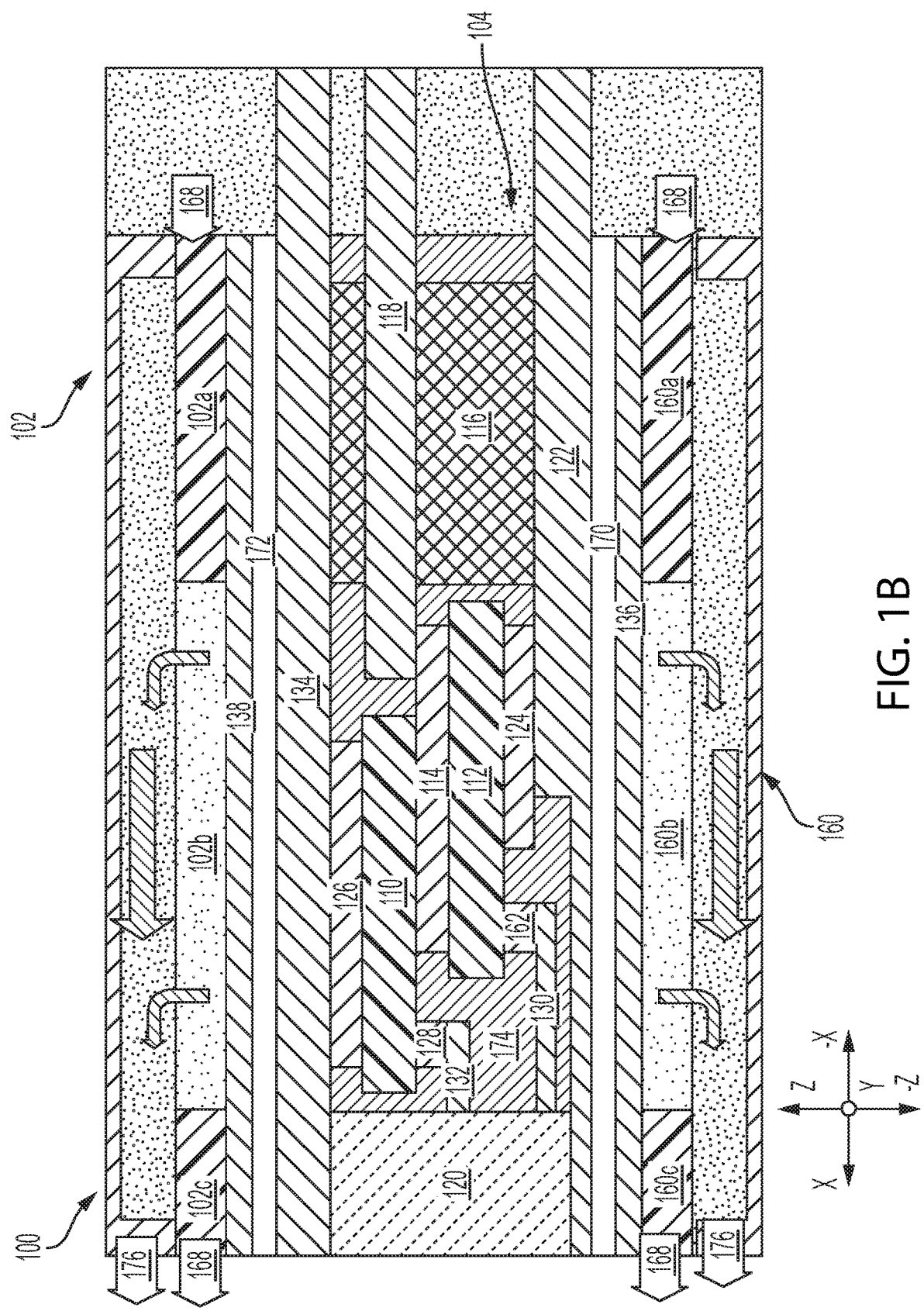
FIG. 1B is a diagram of an example of a side view of the power electronics assembly according to an embodiment.

FIG. 1B is a more detailed side view (e.g., cross-sectional view) of the power electronics assembly 100 as shown along section or plane 1B-1B of FIG. 1A. In particular, the first power electronics module 104 is illustrated and discussed in detail below. It will be understood that the second power electronics module 106 and the third power electronics module 108 may be similarly and/or identically formed to the first power electronics module 104.

As illustrated, the first power electronics module 104 includes a first transistor 110 and a second transistor 112. The first transistor 110 and second transistor 112 are vertically-stacked to be directly positioned on each other. The first and second transistors 110, 112 may be MOSFETs (e.g., Metal Oxide Silicon Field Effect Transistor or Metal Oxide Semiconductor Field Effect Transistor), insulated-gate bipolar transistors (IGBT), etc.

As illustrated, the second transistor 112 is disposed beneath the first transistor 110. At least one electrical conductor 114 (e.g., solder) is positioned between the first and second transistors 110, 112. A busbar 118 (e.g., an output busbar) is electrically connected to the first and second transistors 110, 112 through the electrical conductor 114. The busbar 118 may conduct an output electrical signal (e.g., voltage, current, etc.) from the first and second transistors 110, 112. The busbar 118 may be made of a first material (e.g., copper) while the electrical conductor 114 is formed of a second material different (e.g., a solder such as Tin-lead) from the first material. Other busbars may also be formed of the first material and other electrical conductors may be formed of the second material.

The first and second transistors 110, 112 are both electrically connected to the busbar 118. The busbar 118 may conduct an output power signal (e.g., current and/or voltage) from the first and second transistors 110, 112. A gate drive device 120 may provide a voltage and/or current to a gate of the first transistor 110 through a conductive path that includes a busbar 132 and electrical conductor 128 to control a state (e.g., conducting current or not conducting current) of the first transistor 110. The gate drive device 120 may provide a voltage and/or current to a gate of the second transistor 112 through a conductive path that includes a busbar 162 and electrical conductor 130 to control a state (e.g., conducting current or not conducting current) of the second transistor 112.

In this particular example, the gate drive device 120 may be connected to gates of the first and second transistors 110, 112 to control the first and second transistors 110, 112 to be placed in opposite states from each other. For example, when the first transistor 110 is in an ON state (e.g., conducting current), the second transistor 112 may be in an OFF state. In the ON state, the first transistor 110 may supply and/or modify current and/or voltage from P-busbar 134, while in an OFF state the first transistor 110 may operate as an open circuit to not supply the current and/or the voltage. The P-busbar 134 may be electrically coupled to a terminal (e.g., a source) of the first transistor 110 through electrical conductor 126 and to supply voltage and/or current to the first transistor 110. Therefore, the current (e.g., as part of an electrical signal) from the first transistor 110 may be output from a terminal of the first transistor 110 (e.g., a drain) and conducted through the electrical conductor 114 to the busbar 118. The second transistor 110 may not be conducting current, and therefore does not influence the output of the first transistor 110.

Similarly, an electrical conductor 124 may electrically connect a terminal (e.g., source) of the second transistor 112 and a N-busbar 122. The N-busbar 122 may be electrically coupled to the second transistor 112 through the electrical conductor 124 to supply voltage and/or current to the second transistor 112. The second transistor 112 may modify the voltage and/or current and supply the modified voltage and/or current to the busbar 118 through a terminal (e.g., a drain) of the second transistor 112.

Further, the gate drive device 120 may control the first and second transistors 110, 112 so that when the second transistor 112 is in an ON state (e.g., conducting current), the first transistor 110 may be in an OFF state. Therefore, the current (e.g., as part of an electrical signal) from the second transistor 112 may be conducted through the electrical conductor 114 to the busbar 118. The first transistor 112 may not be conducting current, and therefore does not influence the output of the second transistor 112. As such, while both of the first and second transistors 110, 112 may be electrically connected to the busbar 118, only one of the first and second transistors 110, 112 may provide an electrical signal to the busbar 118 at a single time.

As illustrated, in this example, the first and second transistors 110, 112 may be offset and staggered relative to each other. In doing so, heat emitted by the first and second transistors 110, 112 may be distributed throughout a larger space to avoid excessive concentrations of heat. For example, as illustrated the first and second transistors 110, 112 are disposed proximate each other and directly connected to opposite sides of electrical conductor 114. For example, the electrical conductor 114 includes a first portion that is directly connected to the first transistor 110 and a second portion that is directly connected to the second transistor 112. The first portion is disposed opposite the second portion. For example, the first portion is an upper side of the electrical conductor 114 and the second portion is a lower side of the electrical conductor 114. The busbar 118 may be in direct contact with a third portion of the electrical conductor 114, to electrically connect the busbar 118 to the first and second transistors 110, 112 to conduct a power signal from the first and second transistors 110, 112. The third portion may be part of the upper side of the electrical conductor 114, and disposed proximate to the first portion of the electrical conductor 114.

The busbar 118 may be coupled to the first and second transistors 110, 112 through the electrical conductor 114. In doing so, a size of the first power electronics module 104 may be reduced relative to other designs that may include numerous conductors. Moreover, the first and second transistors 110, 112 may be disposed closer together and may only be separated by the electrical conductor 114 further reducing the size of the first power electronics module 104.

The first power electronics module 104 may further include a capacitor 116 that encloses the busbar 118. The capacitor 116 may reduce parasitic inductances of electric wiring (e.g., snubber capacitors) such as the busbar 118. As illustrated, the busbar 118 (e.g., output busbar) is positioned between input P and N busbars 134, 122 and may protrude on an opposite side of input P and N busbars 134, 122. Electrical insulation layers 172, 170 may be further be provided.

The first hybrid cooling assembly 102 (e.g., a cooling device) is disposed above the first power electronics module 104. Two-phase cooling portion 102b aligns with (e.g., directly above) to cool the first and second transistors 110, 112. At the two-phase cooling portion 102b, coolant may move through metal inverse opals (MIO) or porous metal structure by capillary flow. Heat from the first and second transistors 110, 112 may cause the coolant to change from liquid to vapor (as represented by the upward arrows), hence resulting in two-phase cooling.

Compared to single-phase cooling, two-phase cooling may achieve greater heat transfer away from electronic components. Thus, the two-phase cooling portion 102b may apply to high heat flux devices (cool the high heat flux devices). Further, the first hybrid cooling assembly 102 may include a single-phase cooling portions 102a, 102c to cool low heat flux devices (e.g., capacitors and gate drive devices), such as the capacitor 116 and gate drive device 120. As illustrated, the first and second transistors 110, 112 are sandwiched between the two-phase cooling portion 102b of the first hybrid cooling assembly 102, and a two-phase cooling portion 160b of the second hybrid cooling assembly 160. The single-phase cooling portion 102a of the first hybrid cooling assembly 102 and single-phase cooling portion 160a of the second hybrid cooling assembly 160 may cool and sandwich the capacitor 116. The single-phase cooling portion 102c of the first hybrid cooling assembly 102 and single-phase cooling portion 160c of the second hybrid cooling assembly 160 may cool and sandwich the gate drive device 120.

Cooling fluid 168 flows along the X-axis in the two-phase cooling portions 102b, 160b and single-phase cooling portion 102a, 160a, 102c, 160c (e.g., hybrid two-phase cooling), to cool the electronic components therebetween. The cooling fluid 168 (e.g., a liquid) may evaporate into vapor 176. Copper 136, 138 and electrical insulation layers 170, 172 may also be a part of the power electronics assembly 100. Mold resin 174 may also provide electrical insulation between various components. As already noted, each of the second and third power electronics modules 106, 108 may be similarly formed to each include two transistors positioned and connected to busbars as described above and to include similar components as described with respect to the first power electronics module 104.

Figure 1C:
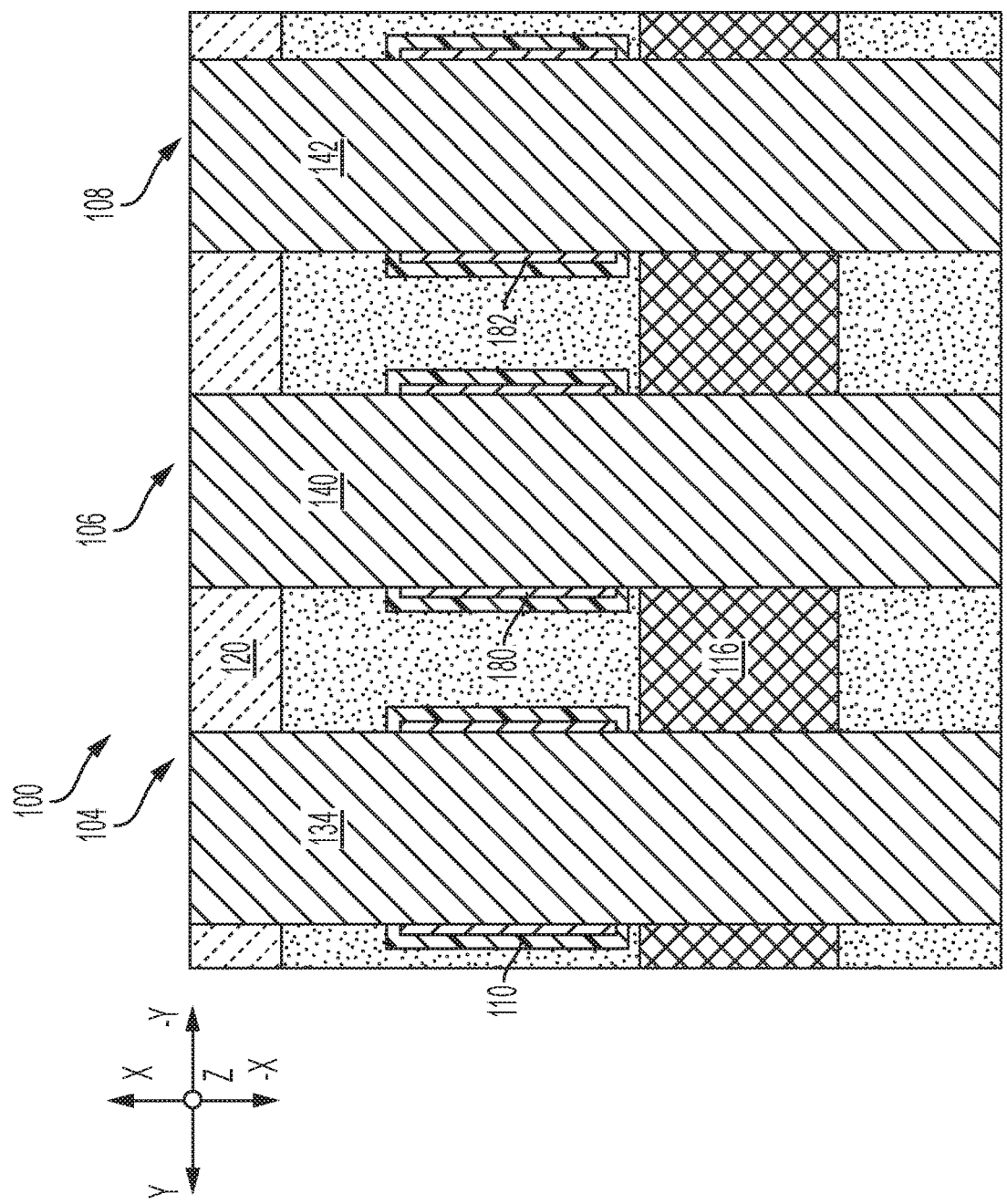
FIG. 1C is a diagram of an example of a cross-sectional view of the power electronics assembly according to an embodiment.

FIG. 1C illustrates a cross-sectional view (e.g., downward view) along line 1C-1C of FIG. 1A. The capacitor 116 may extend across first transistor 110 of the first power electronics module 104, a first transistor 180 of the second power electronics module 106 and a first transistor 182 of the third power electronics module 108. Similarly, the gate drive device 120 may extend across the first transistors 110, 180, 182. P-Busbars 134, 140, 142 may extend over the first transistors 110, 180, 182. Each of the second and third power electronics module 106, 108 may include transistors (not illustrated) below the first transistors 180, 182. The second transistor 112 may be beneath the first transistor 110 of the first power electronics module 104.

Thus, the first power electronics module 104 includes a first portion of the capacitor 116 extending across opposite sides of the first power electronics module 104 and the capacitor 116 may be electrically connected to the busbar 118. The second power electronics module 106 includes the first transistor 180 (e.g., which may also be referred to as a third transistor in some embodiments), and another transistor (e.g., a fourth transistor) disposed beneath the first transistor 190, a second portion of the capacitor 116 and the busbar 140 (e.g., an output busbar). Therefore, the capacitor 116 extends across opposite sides of the second power electronics module 106, and the capacitor 116 may be electrically connected to the busbar 140 of the second power electronics apparatus 106. The third power electronics module 108 may be similarly formed to the second power electronics module 106.

The first power electronics module 104 further includes the gate drive device 120 extending across the opposite sides of the first power electronics module 104, where the gate drive device 120 controls the first and second transistors 110, 112. The second power electronics module 106 further includes the gate drive device 120, where the gate drive device 120 extends across the opposite sides of the second power electronics apparatus 106. The gate drive device 120 may control the transistor 180 of the second power electronics module 106, and any other unillustrated transistor of the second power electronics module 106.

Figure 2:
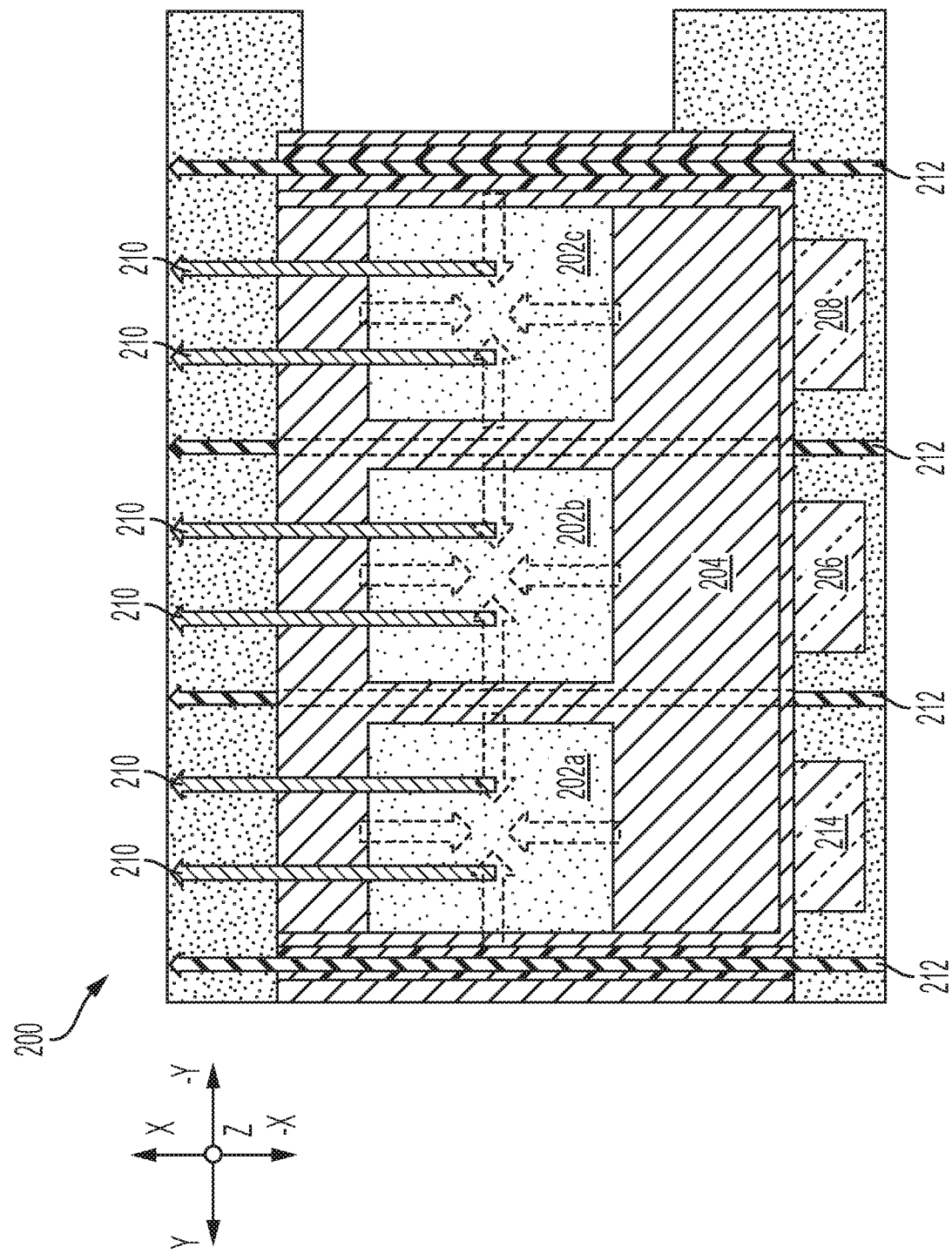
FIG. 2 is a diagram of an example of a top-down view of a hybrid cooling assembly according to an embodiment.

FIG. 2 illustrates a hybrid cooling assembly 200. The hybrid cooling assembly 200 may be readily substituted for any of the first and second hybrid cooling assemblies 102, 160 of FIGS. 1A and 1B with some modifications to align two-phase cooling portions with high heat flux components (e.g., transistors) and single-phase cooling portions with low heat flux components (e.g., capacitors and gate driver devices). FIG. 2 is a top-down view of the assembly 200. Busbars 206, 208, 214 may be below the hybrid cooling assembly 200.

Coolant 212 may pass through the single-phase cooling portion 204. Each of two-phase cooling portions 202a-202c may include a capillary flow as illustrated by the hatched arrows. The two-phase cooling portions 202a-202c may be a MIO or Porous metal structure. The two-phase cooling portions 202a-202c may generate and output vapor 210. Each of the two-phase cooling portions 202a-202c may align with transistors of a respective power electronics module.

The single-phase cooling portion 204 may align with capacitors and gate drive devices. The two-phase cooling portion 202a-202c may align with transistors to cool the transistors.

Figure 3:
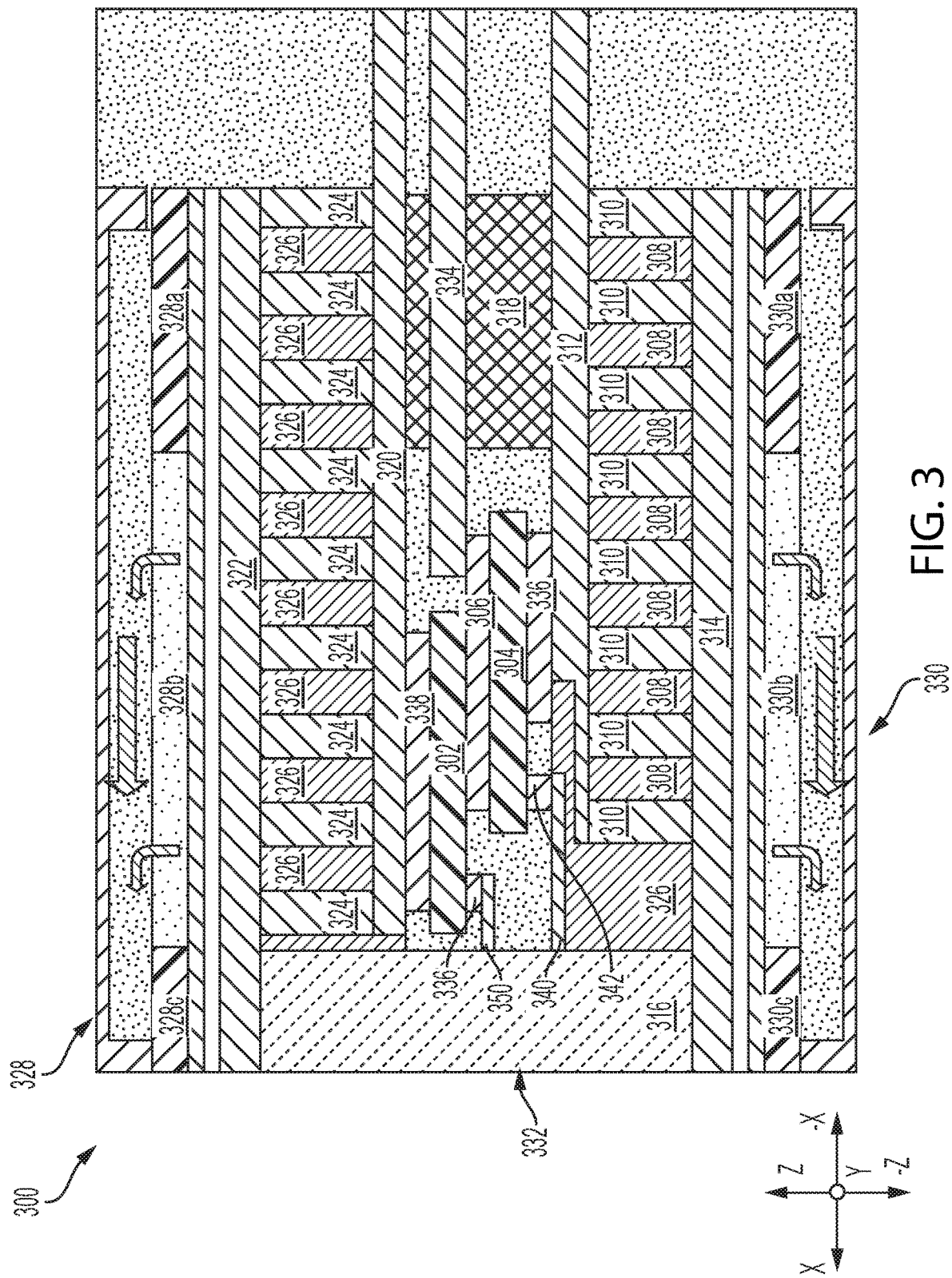
FIG. 3 is a diagram of an example of a side view of a power electronics assembly according to an embodiment.

FIG. 3 is a side view of a power electronics assembly 300 that includes a power electronics module 332 with vias 324 (e.g., electrical conductors) extending through a particle circuit board (PCB) 326, and vias 310 extending through PCB 308. Sources of the transistors 302, 304 (e.g., MOSFETS) are electrically connected to input busbars 322, 314 through the vias 310, 324 in the PCBs 308, 326, and busbars 312, 320 as well as electrical conductors (e.g., solder) 336, 338. An output busbar 334 is further electrically coupled to drains of the first and second transistors 302, 304 through electrical conductor 306. In some embodiments, the output busbar 334 may be connected to the electrical conductor 306 through vias in a PCB if the output busbar 334 is separated from the transistors 302, 304 by the PCB. A capacitor 318 may enclose the output busbar 334. A gate drive device 316 may be connected to a gate of the first transistor 302 through an electrical conductor 336 and busbar 350 to control states of the first transistor 302. The gate drive device 316 may be connected to a gate of the second transistor 304 through an electrical conductor 342 and busbar 340 to control states of the second transistor 304.

As illustrated cooling assemblies 328, 330 may cool the power electronics assembly 300. For example, single-phase cooling portions 328a, 330a may cool the capacitor 318, and single-phase cooling portions 328c, 330c may cool the gate drive device 316. Two-phase cooling portions 328b, 330b may cool the first and second transistors 302, 304.

The power electronics module 332 may be readily substituted for any of the first power electronics module 104, second power electronics module 106 and third power electronics module 108 (FIG. 1) already described. In some embodiments, the power electronics module 332 may be used in conjunction with one or more of the first power electronics module 104, second power electronics module 106 and third power electronics module 108 (FIG. 1) already described.

Figure 4A:
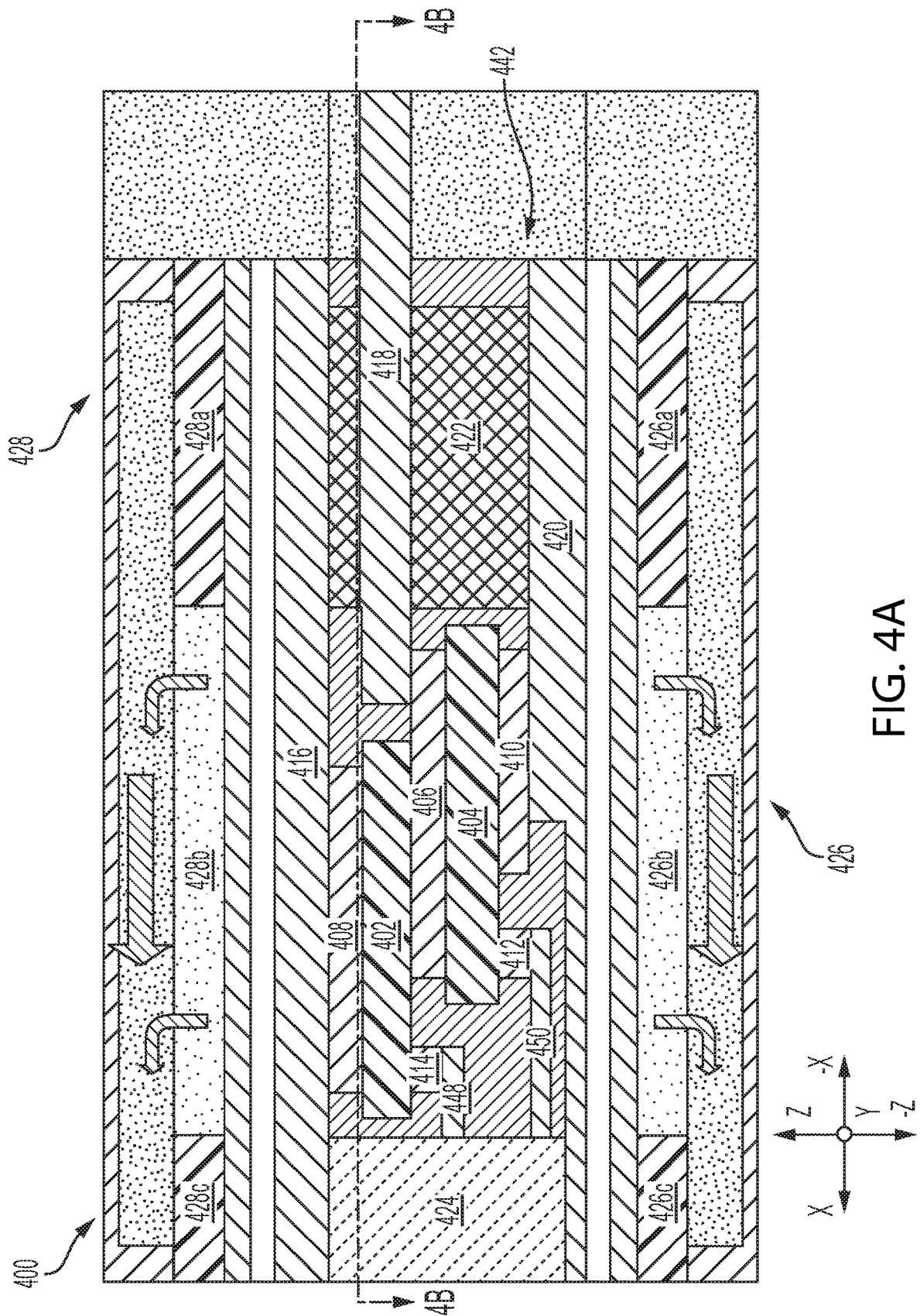
FIG. 4A is a diagram of an example of a side view of a power electronics assembly according to an embodiment.

FIG. 4A is a side view of a power electronics assembly 400. FIG. 4A illustrates a side view with of the power electronics assembly 400. A first power electronics assembly 442 is illustrated. The first power electronics assembly 442 includes first and second transistors 402, 404 that are vertically offset from one another and staggered. The operation of the power electronics assembly 400, including the first and second transistors 402, 404, may be similar to that as described above with respect to power electronics assembly 100. The first power electronics assembly 442 may include enhanced input busbars 416, 420 connected to first and second transistors 402, 404 through electrical conductors 408, 410. For example, the input busbars 416, 420 may have a greater dimensions (e.g., width) to alleviate concentrations of heat by spreading the heat over a larger area.

An output busbar 418 is electrically coupled to drains of the first and second transistors 402, 404 through electrical conductor 406. In some embodiments, the output busbar 418 may be enhanced by increasing dimensions (e.g., width) of the output busbar 418 to spread heat. A capacitor 422 may enclose the output busbar 418.

A gate drive device 424 may be connected to a gate of the first transistor 402 through an electrical conductor 414 and busbar 448 to control states of the first transistor 402. The gate drive device 424 may be connected to a gate of the second transistor 404 through an electrical conductor 412 and busbar 450 to control states of the second transistor 404.

As illustrated cooling assemblies 428, 426 may cool the first power electronics module 442. For example, single-phase cooling portions 426a, 428a may cool the capacitor 422, and single-phase cooling portions 426c, 428c may cool the gate drive device 424. Two-phase cooling portions 428b, 426b may cool the first and second transistors 402, 404.

Figure 4B:
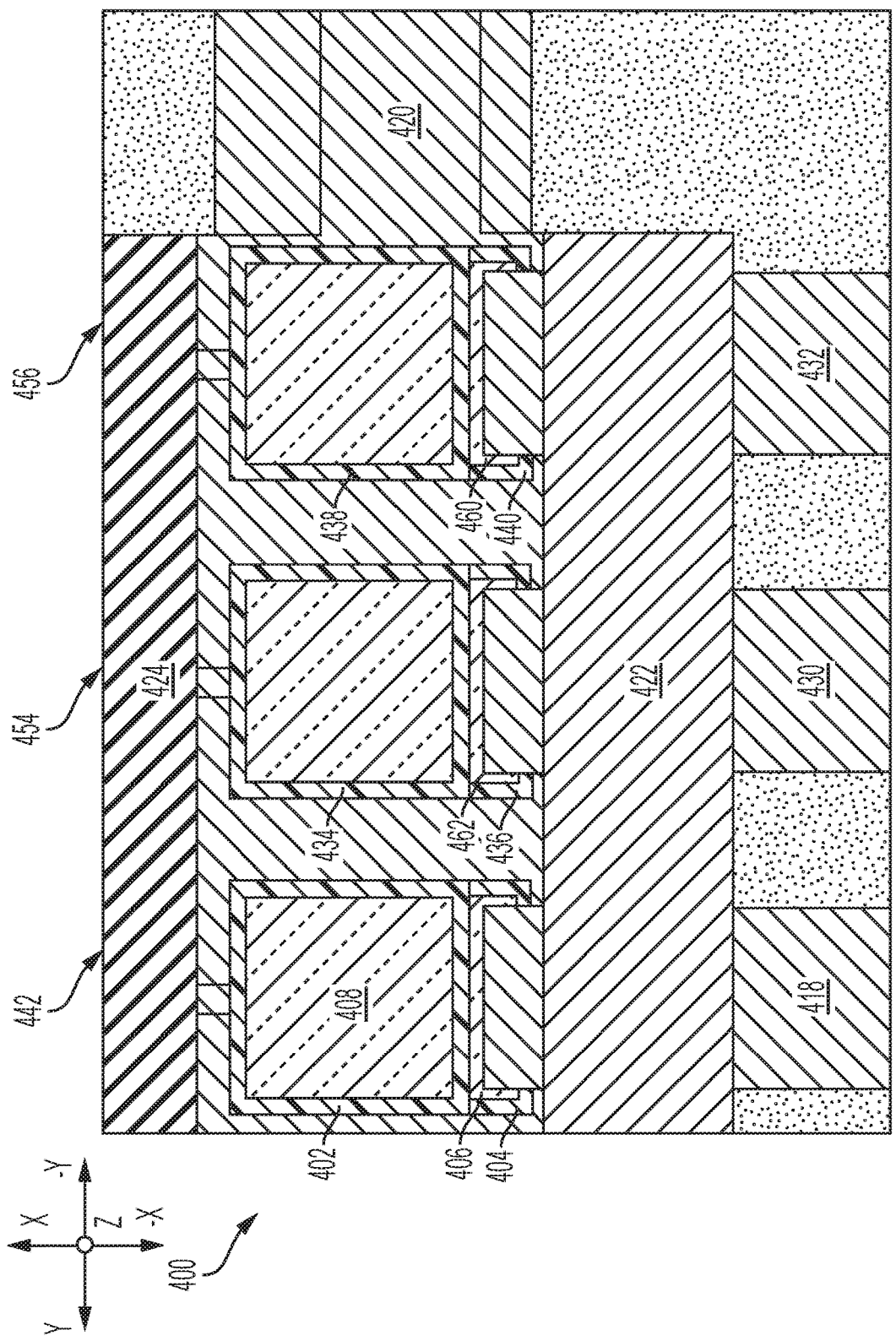
FIG. 4B is a diagram of an example of a cross-sectional view of a power electronics assembly according to an embodiment.

FIG. 4B is a cross-sectional (e.g., top-down) view of the power electronics assembly 400 along line 4B-4B of FIG. 4A with some elements omitted for clarity. As illustrated, the power electronics assembly 400 includes second and third power electronics assemblies 454, 456. The second and third power electronics assemblies 454, 456 may be similarly formed and/or identical to first power electronics module 442. As illustrated, the output busbar 418, may be connected with first and second transistors 402, 404 through electrical conductor 406. The output busbars 430, 432 may likewise be respectively connected to transistors 434, 436 of the second power electronics assembly 454 through electrical conductor 462, and the transistors 438, 440 of the third power electronics assembly 456 and through the electrical conductor 460. The capacitor 422 may enclose and extend over the output busbars 418, 430, 432. As illustrated the busbar 420 has a substantially widened width to dissipate heat. The busbar 416 may be similarly formed.

Figure 5A:
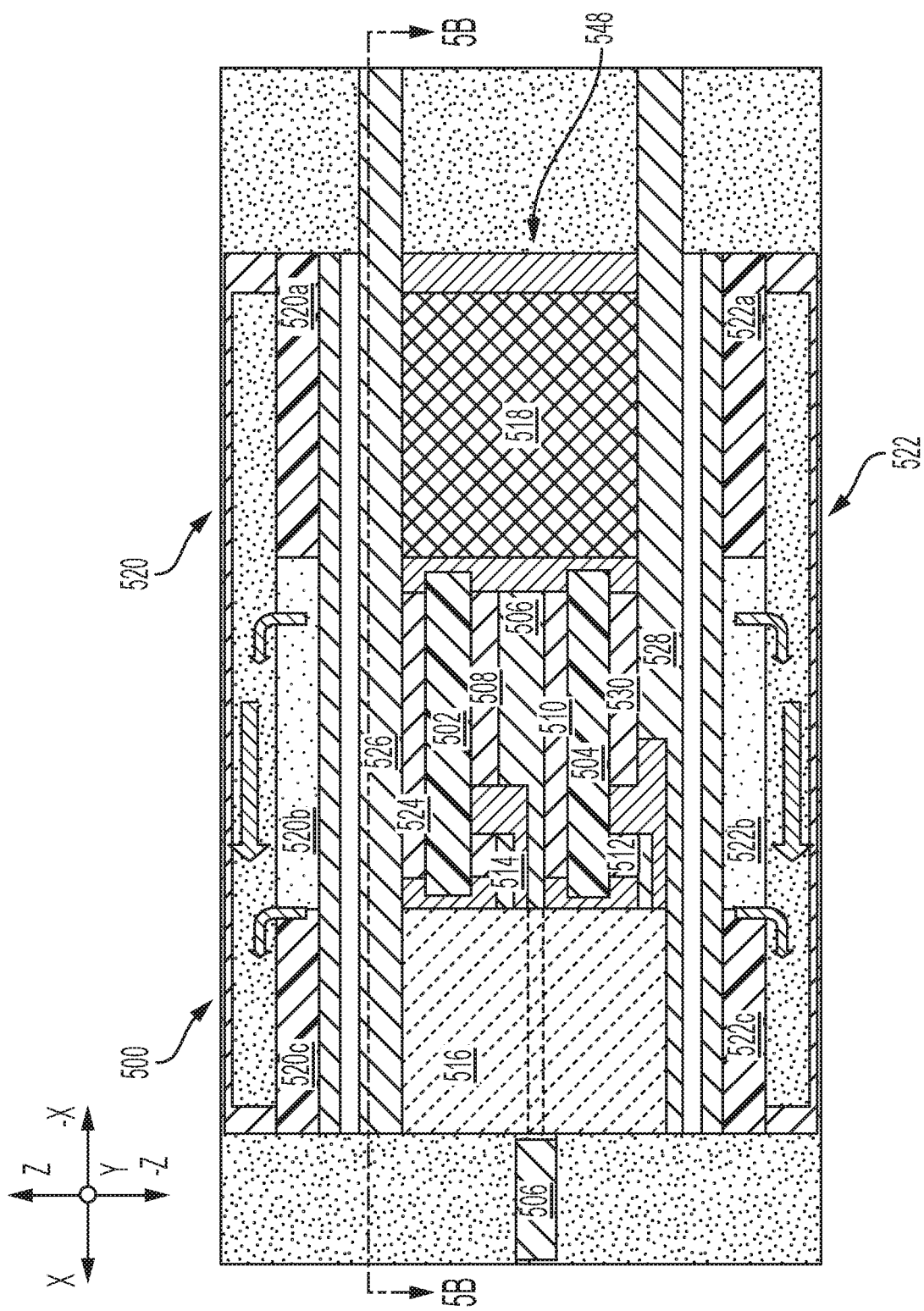
FIG. 5A is a diagram of an example of a side view of a power electronics assembly according to an embodiment.

FIG. 5A is a side view of a power electronics assembly 500 with a first power electronics module 548. The first power electronics module 548 includes an output busbar 506 disposed vertically between first and second transistors 502, 504. The first transistor 502 is disposed directly vertically above the second transistor 504.

The operation of the power electronics assembly 500, including the first and second transistors 502, 504, may be similar to that as described above with respect to power electronics assembly 100 (FIG. 1). The output busbar 506 is electrically coupled to drains of the first and second transistors 502, 504 through two different first and second electrical conductors 508, 510. For example, the first electrical conductor 508 is directly connected with first transistor 502 and output busbar 506. The second electrical conductor 510 is directly connected with second transistor 504 and output busbar 506.

A gate drive device 516 may enclose the output busbar 506. The gate drive device 516 may be connected to gates of first and second transistors 502, 504 through electrical paths 514, 512 (e.g., solder and busbars). The input busbar 528 (e.g., an N-busbar) may be connected with a source of the second transistor 504 through electrical conductor 530. The input busbar 526 (e.g., a P-busbar) may be connected with a source of the first transistor 504 through electrical conductor 524.

As illustrated cooling assemblies 520, 522 may cool the first power electronics module 548. For example, single-phase cooling portions 520a, 522a may cool the capacitor 518, and single-phase cooling portions 520c, 522c may cool the gate drive device 516. Two-phase cooling portions 520b, 522b may cool the first and second transistors 502, 504.

Figure 5B:
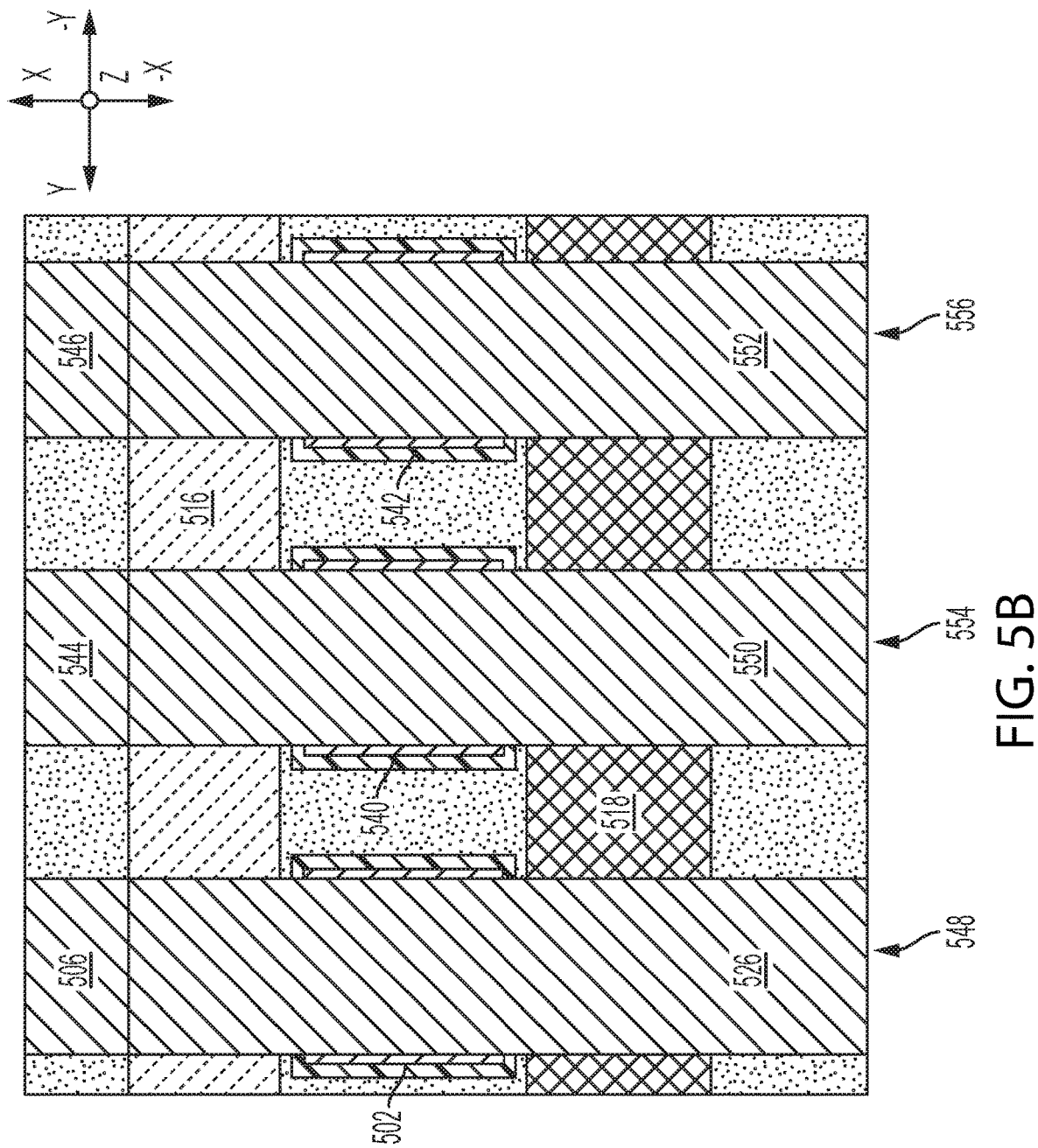
FIG. 5B is a diagram of an example of a top-down view of a power electronics assembly according to an embodiment.

FIG. 5B illustrates an overhead view of the power electronics assembly 500 along line 5B-5B of FIG. 5A. The power electronics assembly 500 includes second and third power electronics assemblies 554, 556 that are formed similarly and/or identically to the first power electronics assembly 548. For example, the second power electronics assembly 554 may include a first transistor 540 that is connected with an output busbar 544. While not illustrated, the output busbar 544 may be disposed between the first transistor 540 and a second transistor (not illustrated) of the second power electronics assembly 554. The third power electronics module 556 may include a first transistor 542 that is connected with an output busbar 546. While not illustrated, the output busbar 546 may be disposed between the first transistor 542 and a second transistor (not illustrated) of the third power electronics module 556. Input busbars (e.g., P-busbars) 550, 552 may further be coupled with the first transistors 540, 542.

Figure 6:
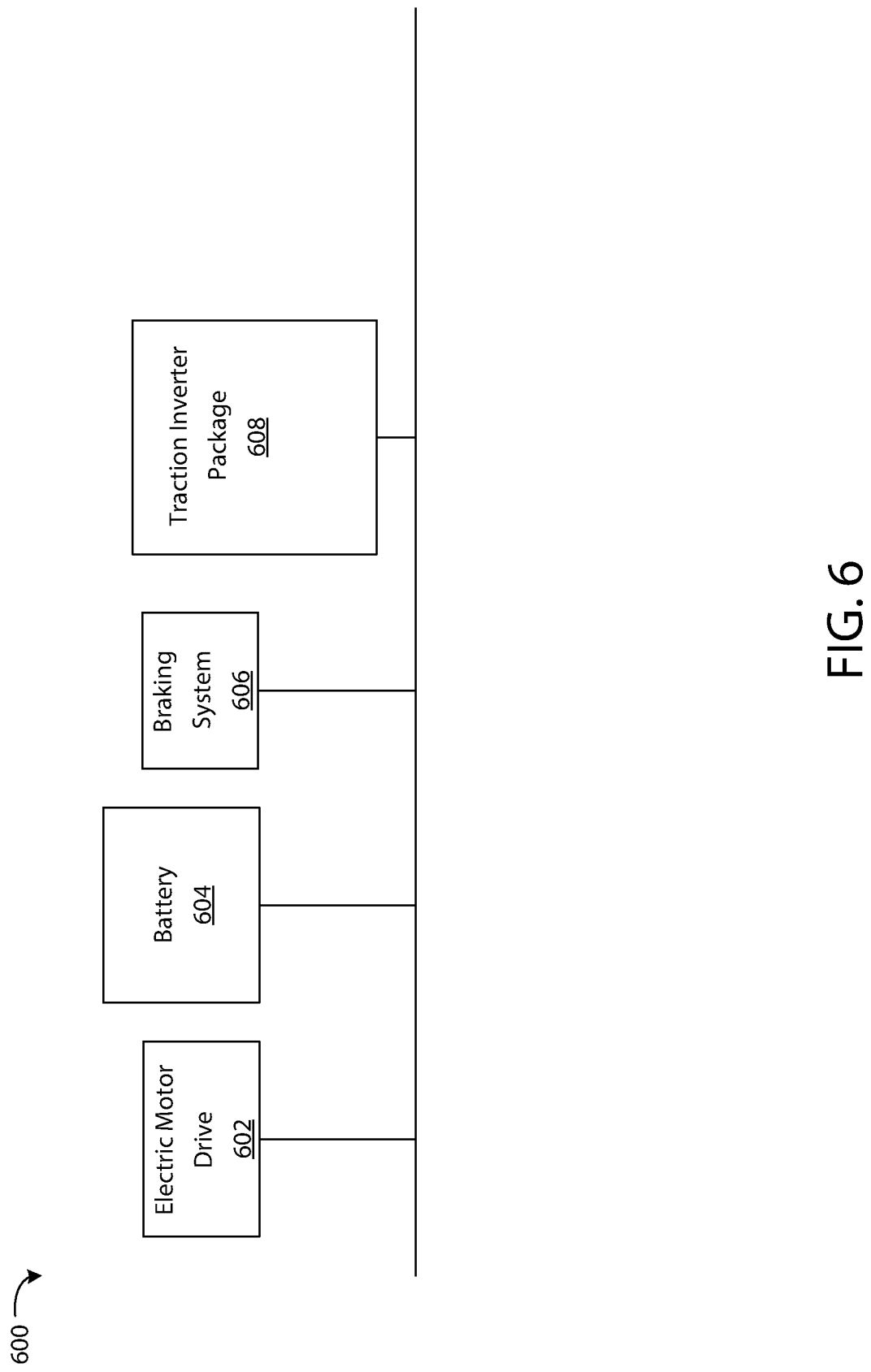
FIG. 6 is a block diagram of an example of a vehicle according to an embodiment.

FIG. 6 illustrates a vehicle 600 that includes a traction inverter package 608. The traction inverter package 608 may be coupled to battery 604 and electric motor drive 602. The traction inverter package 608 may convert DC current from the battery 604 to AC current. The traction inverter package 608 may provide the AC current to the electric motor drive 602 to drive a propulsion system of the vehicle 600. Moreover, the traction inverter package 608 may capture energy from the braking system 606 and feed the energy back to the battery 604. The aforementioned power electronics assemblies 100, 300, 400 and 500 (FIGS. 1, 3, 4 and 5) may be a part of the traction inverter package 608.

Figure 7:
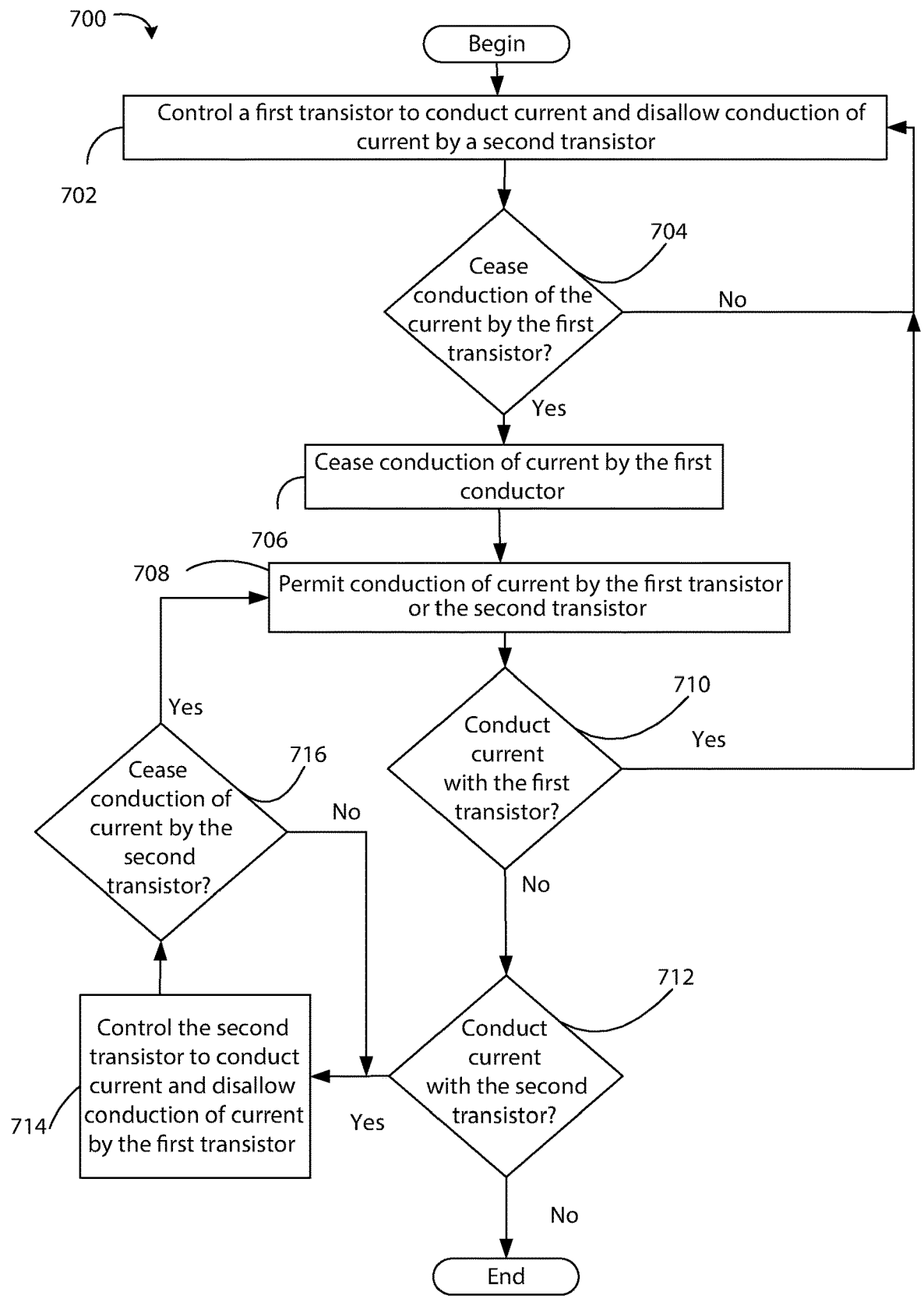
FIG. 7 is a flowchart of an example of a method of controlling transistors by a gate drive device according to an embodiment.

FIG. 7 illustrates a method 700 of controlling transistors by a gate drive device. The method 700 may be implemented by a gate drive device, and may generally be implemented in the gate drive device 120 (FIGS. 1B and 1C), the gate drive device 316 (FIG. 3), the gate drive device 424 (FIGS. 4A and 4B) and/or the gate drive device 516 (FIGS. 5A and 5B), already discussed. In some embodiments, the method 700 may be implemented as one or more modules in a set of logic instructions stored in a non-transitory machine- or computer-readable storage medium. In some embodiments, the method 700 may be implemented in configurable logic such as, for example, programmable logic arrays (PLAs) and/or in fixed-functionality hardware logic using circuit technology such as application specific integrated circuit (ASIC).

Illustrated processing block 702 controls a first transistor to conduct current and disallow conduction of current by a second transistor (e.g., places the transistor into an "on state" so the first transistor conducts current). For example, current conduction between a drain (D) terminal of the first transistor and a source (S) terminal of the first transistor may be controlled by a voltage applied to the gate (G) terminal of the first transistor. In some embodiments, the first transistor may also include a body (B) terminal that is not discussed in detail. The second transistor may be formed similarly to the first transistor. The method 700 may control the voltage applied to the gate terminal to control the first transistor to be in an on state (conduct current) or off state (does not conduct current). The first transistor and the second transistor may correspond to any of the first and second transistors referenced herein, such as the first and second transistors 110, 112 (FIG. 1), the first and second transistors 302, 304 (FIG. 3), the first and second transistors 402, 404 (FIGS. 4A and 4B), the first and second transistors 502, 504 (FIGS. 5A and 5B). In some embodiments, the first and second transistors may share a common output bus, and method 700 may only permit one transistor to output current to the output bus at any one time.

Illustrated processing block 704 determines whether to cease conduction of current by the first transistor. If not, processing block 702 continues. Otherwise, illustrated processing block 706 ceases conduction of the current by the first conductor (e.g., places the transistor into an "off state" so the first transistor does not conduct current). Illustrated processing block 708 permits conduction of current by the first transistor or the second transistor. Illustrated processing block 710 determines whether to conduct current with the first transistor. If so, processing block 702 executes. Otherwise, illustrated processing block 712 determines whether to conduct current with the second transistor. If so, illustrated processing block 714 controls the second transistor to conduct current (e.g., applies a voltage to the gate terminal of the second transistor to fully bias the second transistor) and disallow conduction of current by the first transistor (e.g., apply no voltage to the gate terminal of the first transistor). Otherwise, the method 700 may end.

Illustrated processing block 716 determines whether to cease conduction of current by the second transistor. If so, illustrated processing block 708 executes. Otherwise, processing block 714 continues to execute.

The method 700 may enhance operation by allowing two transistors to share a single output busbar while still maintaining accurate performance. In doing so, an overall size of a semiconductor package that includes the first and second transistors may be reduced.

The above described methods and systems may be readily combined together if desired. The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present disclosure can be implemented in a variety of forms. Therefore, while the embodiments of this disclosure have been described in connection with particular examples thereof, the true scope of the embodiments of the present disclosure should not be so limited since other modifications will become apparent to the skilled practitioner upon a study of the drawings, specification, and following claims.

We claim:

1. A first power electronics apparatus comprising:
a first transistor;
a second transistor stacked on the first transistor, wherein the first transistor is disposed directly vertically above the second transistor;
at least one electrical conductor that is positioned between the first and second transistors and electrically connected to the first and second transistors;
a busbar that is electrically connected to the first and second transistors through the at least one electrical conductor; and
a capacitor extending across opposite sides of the first power electronics apparatus, wherein the capacitor is electrically connected to the busbar.

2. The first power electronics apparatus of claim 1, wherein the at least one electrical conductor includes a first electrical conductor, wherein the first electrical conductor includes a first portion that is directly connected to the first transistor and a second portion that is directly connected to the second transistor.

3. The first power electronics apparatus of claim 2, wherein the first portion and the second portion are disposed on opposite sides of the first electrical conductor.

4. The first power electronics apparatus of claim 2, wherein the busbar is in direct contact with a third portion of the first electrical conductor, wherein the busbar conducts an output power signal from one or more of the first transistor or the second transistor.

5. The first power electronics apparatus of claim 1, wherein the busbar is disposed between the first and second transistors.

6. The first power electronics apparatus of claim 5, wherein the at least one electrical conductor includes:
a first electrical conductor disposed on a first side of the busbar and in direct contact with the first transistor; and
a second electrical conductor disposed on a second side of the busbar and in direct contact with the second transistor, wherein the first side is opposite the second side.

7. A power electronics assembly comprising:
a first power electronics apparatus including:
a first transistor;
a second transistor stacked on the first transistor;
at least one electrical conductor that is positioned between the first and second transistors and electrically connected to the first and second transistors; and
a first busbar that is electrically connected to the first and second transistors through the at least one electrical conductor,
a capacitor extending across opposite sides of the first power electronics apparatus, wherein the capacitor is electrically connected to the first busbar; and
a second power electronics apparatus including:
a third transistor;
a fourth transistor;
the capacitor; and
a second busbar,
wherein the capacitor extends across opposite sides of the second power electronics apparatus, wherein the capacitor is electrically connected to the second busbar of the second power electronics apparatus.

8. The power electronics assembly of claim 7, wherein:
the first power electronics apparatus further includes a gate drive device extending across the opposite sides of the first power electronics apparatus, wherein the gate drive device controls the first and second transistors; and
the second power electronics apparatus further includes the gate drive device, wherein the gate drive device extends across the opposite sides of the second power electronics apparatus, wherein the gate drive device controls the third and fourth transistors.

9. The power electronics assembly of claim 8, further comprising a cooling device, the cooling device including:
single-phase cooling portions that cool the capacitor and the gate drive device; and
two-phase cooling portions that cool the first transistor, the second transistor, the third transistor and the fourth transistor.

10. A vehicle comprising:
an electric motor drive;
a battery to supply a current; and
a traction inverter package to modify the current of the battery and provide the modified current to the electric motor drive, the traction inverter package including a first power electronics apparatus comprising:

a first transistor;

a second transistor stacked on the first transistor, wherein the first transistor is disposed directly vertically above the second transistor;

at least one electrical conductor that is positioned between the first and second transistors and electrically connected to the first and second transistors;

a first busbar that is electrically connected to the first and second transistors through the at least one electrical conductor; and a capacitor extending across opposite sides of the first power electronics apparatus, wherein the capacitor is electrically connected to the first busbar.

11. The vehicle of claim 10, wherein the at least one electrical conductor includes a first electrical conductor, wherein the first electrical conductor includes a first portion that is directly connected to the first transistor and a second portion that is directly connected to the second transistor.

12. The vehicle of claim 11, wherein the first portion and the second portion are disposed on opposite sides of the first electrical conductor.

13. The vehicle of claim 11, wherein the first busbar is in direct contact with a third portion of the first electrical conductor, wherein the first busbar conducts an output power signal from one or more of the first transistor or the second transistor.

14. The vehicle of claim 10, wherein the first busbar is disposed between the first and second transistors.

15. The vehicle of claim 14, wherein the at least one electrical conductor includes:

a first electrical conductor disposed on a first side of the first busbar and in direct contact with the first transistor; and a second electrical conductor disposed on a second side of the first busbar and in direct contact with the second transistor, wherein the first side is opposite the second side.

16. The vehicle of claim 10, wherein:

the traction inverter package further comprises a second power electronics apparatus including a third transistor, a fourth transistor, the capacitor and a second busbar, wherein the capacitor extends across opposite sides of the second power electronics apparatus, wherein the capacitor is electrically connected to the second busbar of the second power electronics apparatus.

17. The vehicle of claim 16, wherein:

the first power electronics apparatus further includes a gate drive device extending across the opposite sides of the first power electronics apparatus, wherein the gate drive device controls the first and second transistors; and the second power electronics apparatus further includes the gate drive device, wherein the gate drive device extends across the opposite sides of the second power electronics apparatus, wherein the gate drive device controls the third and fourth transistors.

18. The vehicle of claim 17, further comprising a cooling device including:

single-phase cooling portions that cool the capacitor and the gate drive device; and two-phase cooling portions that cool the first transistor, the second transistor, the third transistor and the fourth transistor.

* * * * *